United States Patent [19]
Hayashide et al.

[11] Patent Number: 5,290,729
[45] Date of Patent: Mar. 1, 1994

[54] STACKED TYPE CAPACITOR HAVING A DIELECTRIC FILM FORMED ON A ROUGH SURFACE OF AN ELECTRODE AND METHOD OF MANUFACTURING THEREOF

[75] Inventors: Yoshio Hayashide; Wataru Wakamiya, both of Hyogo, Japan

[73] Assignee: Mitsubishi Denki Kabushiki Kaisha, Tokyo, Japan

[21] Appl. No.: 876,808

[22] Filed: Apr. 30, 1992

Related U.S. Application Data

[62] Division of Ser. No. 654,100, Feb. 12, 1991, abandoned.

[30] Foreign Application Priority Data

Feb. 16, 1990 [JP] Japan .................................. 2-36928
Sep. 25, 1990 [JP] Japan ................................ 2-256653

[51] Int. Cl.⁵ .......................................... H01L 21/441
[52] U.S. Cl. .................................. 437/60; 437/233; 437/977; 148/DIG. 1
[58] Field of Search ............... 357/23.6, 54; 437/47, 437/60, 233, 919, 967, 977; 148/DIG. 1, DIG. 14, DIG. 122, DIG. 138

[56] References Cited

U.S. PATENT DOCUMENTS

| | | | |
|---|---|---|---|
| 4,855,801 | 8/1989 | Kuesters | 357/54 |
| 4,874,716 | 10/1989 | Rao et al. | 437/60 |
| 5,043,780 | 8/1991 | Fazan et al. | 357/23.6 |

FOREIGN PATENT DOCUMENTS

| | | | |
|---|---|---|---|
| 59-56754 | 4/1984 | Japan . | |
| 61-279166 | 12/1986 | Japan | 357/51 |
| 64-42161 | 2/1989 | Japan . | |
| 1-257365 | 10/1989 | Japan | 357/23.6 |
| 1-270343 | 10/1989 | Japan | 357/23.6 |

OTHER PUBLICATIONS

Joubert et al., "The Effect of Low Pressure on the Structure of LPCVD Polycrystalline Silicon Films", J. Electrochem. Soc. Solid State Science & Tech., Oct. 1987, pp. 2541–2545.

Wolf et al., "Silicon Processing for the VLSI Era", pp. 177–182, 1986.

Extended Abstracts of the 21st Conference on Solid State Devices, "Capacitance-Enhanced Stacked-Capacitor with Engraved Storage Electrode for Deep Submicron DRAMs", Mine et al., 1989, pp. 137–140.

*Primary Examiner*—Brian E. Hearn
*Assistant Examiner*—C. Chaudhari
*Attorney, Agent, or Firm*—Lowe, Price, LeBlanc & Becker

[57] ABSTRACT

A lower electrode of a stacked capacitor in accordance with the present invention is formed of a silicon layer formed by low pressure CVD method. The silicon layer is formed by thermal decomposition of monosilane gas at a prescribed temperature. By setting partial pressure of the monosilane gas and formation temperature at prescribed values, the silicon layer is formed to be in a transitional state between poly crystal and amorphous. Such silicon layer has large concaves and convexes on the surface thereof. Consequently, opposing areas of the electrodes of the capacitor can be increased, and therefore electrostatic capacitance of the capacitor is also increased.

24 Claims, 12 Drawing Sheets

I  ARBITRARY DIRECTION
II  <100> STRUCTURE
III  <110> STRUCTURE
IV  <311> STRUCTURE
V  AMORPHOUS

1

STACKED TYPE CAPACITOR HAVING A DIELECTRIC FILM FORMED ON A ROUGH SURFACE OF AN ELECTRODE AND METHOD OF MANUFACTURING THEREOF

This application is a divisional of U.S. patent application Ser. No. 07/654,100, filed Feb. 12, 1991, now abandoned.

BACKGROUND ART

1. Field of the Invention

The present invention relates to semiconductor devices and, more specifically, to a structure of a capacitor suitable for increasing capacity in a semiconductor device having a so-called stacked type capacitor, and to a method of manufacturing the same.

2. Description of the Background Art

A DRAM (Dynamic Random Access Memory) is one of semiconductor devices or semiconductor memory devices capable of random input/output of memory information. The DRAM comprises a memory cell array serving as a memory region for storing a number of pieces of information, and a peripheral circuit portion for executing prescribed input/output operations to and from the memory cell array. The memory cell array comprises a plurality of memory cells arranged, each serving as a minimum memory unit. The memory cell is basically formed by one capacitor and one transfer gate transistor connected thereto. In operation, whether or not prescribed charges are stored in the capacitor is determined, and the stored information is processed by data "0" or "1" corresponding to the result of determination.

FIG. 9D is a cross sectional view of a memory cell of a conventional DRAM. The DRAM is disclosed in, for example, Japanese Patent Laying-Open No. 64-42161. The memory cell of the DRAM shown in FIG. 9D has a so-called 1 transistor 1 capacitor type cell structure. The transfer gate transistor 10 comprises a pair of n+ impurity regions 3a and 3b formed on the surface of a p type silicon substrate 1, and a gate electrode 5a formed on the surface of the silicon substrate 1 positioned between the n+ impurity regions 3a and 3b with a thin gate insulating film 4 posed therebetween. The gate electrode 5a is formed by a part of a word line. The circumference of the gate electrode 5a is covered by a first interlayer insulating layer 30. The capacitor 20 comprises a lower electrode (storage node) 21 connected to one n+ impurity region 3a, a dielectric layer 22 covering the surface of the lower electrode 21 and an upper electrode (cell plate) 23 covering the surface thereof. A bit line 7 is connected to the n+ impurity region 3b through a contact hole formed in a second interlayer insulating layer 31.

As the degree of integration of semiconductor devices has been increased recently, each of the elements of this type of DRAM must be reduced in size. Accordingly, in such a memory cell as shown in FIG. 9D, planar area of occupation of the capacitor 20 must be reduced. In this circumstance, mainly two methods have been proposed to surely provide prescribed electrostatic capacitance necessary for the operation of the capacitor of the memory cell.

The first method is to increase electrostatic capacitance by making thinner the dielectric layer 22 constituting the capacitor 20. For example, in a DRAM having the degree of integration of 1 M bit, the dielectric layer 22 is made as thin as about 10 nm in silicon oxide film equivalent. Therefore, it is difficult to make this layer thinner when the degree of integration is further increased.

The second method is to surely maintain electrostatic capacitance by increasing opposing area between the electrodes 21 and 23 opposing to each other with the dielectric layer 22 posed therebetween. A capacitor formed in accordance with this method is called a stacked type capacitor. More specifically, a polycrystalline silicon layer having conductivity is formed on a surface of a diffusion layer in the semiconductor substrate, and the dielectric layer and the second electrode layer are stacked on the surface of the silicon layer. Various stacked type capacitors in which the electrode layer formed of polycrystalline silicon has a fin structure, a cylindrical shape and the like have been proposed.

As a modification of the second method, a method of forming concaves and convexes on the surface of the lower electrode to increase the opposing area of the capacitor has been proposed. The memory cell shown in FIG. 9 comprises a capacitor having the lower electrode 21 with concaves and convexes formed on the surface thereof. FIGS. 9A to 9D are cross sectional views showing the steps of manufacturing such a memory cell of the DRAM in this order. The manufacturing method will be described in the following with reference to the figures.

Referring to FIG. 9A, a field oxide film 2 of thin silicon oxide film is formed by LOCOS method on a prescribed region on a surface of a p type silicon substrate 1. Then a gate oxide film 4 is formed on the surface of the p type silicon substrate by thermal oxidation. A polycrystalline silicon layer is deposited on the entire surface by CVD method, and a gate electrode 5a is formed by patterning. Then a silicon oxide film is deposited on the entire surface of the p type silicon substrate 1 by low pressure chemical vapor deposition, and a first interlayer insulating layer 30 is formed on the surface and on the side surfaces of the gate electrode 5a by known lithography and dry etching. Then n+ impurity regions 3a and 3b are formed by ion implantation of impurities to the p type silicon substrate 1 with the gate electrode 5a covered by the interlayer insulating layer 30 serving as a mask.

Then, referring to FIG. 9B, a polycrystalline silicon layer 210 having the thickness of 0.4 μm is formed by low pressure CVD method using monosilane gas diluted to 20% by helium. The pressure is set at 0.8 Torr and the temperature is 680° C. The polycrystalline silicon layer 210 manufactured by this step has concaves and convexes of about 0.07 μm on the surface thereof. Then are introduced to the polycrystalline silicon layer 21 by thermal oxidation using phosphorus oxychloride (POCl$_3$) as a material, at 875° C. for 30 minutes. After phosphor glass formed on the surface of the polycrystalline silicon layer 210 during thermal diffusion is removed, thermal processing is carried out in nitrogen at 900° C. for 20 minutes. Consequently, the concaves and convexes on the surface of the polycrystalline silicon layer are enlarged to 0.11 μm.

Referring to FIG. 9C, the polycrystalline silicon layer 210 is patterned by photolithography and etching to form a lower electrode 21 of the capacitor. Then a thermal nitride film is formed on the surface of the lower electrode 21, a silicon nitride film is formed by CVD method on the surface thereof, and a thermal oxide film is formed by thermal oxidating further thereon. Consequently, a dielectric layer 22 comprising three layers of thermal oxide film/CVD silicon nitride film/silicon oxide film is formed.

Then, referring to FIG. 9D, a polycrystalline silicon layer is formed entirely on the surface of the p type silicon substrate 1 and it is patterned to have a prescribed shape. Consequently, an upper electrode 23 of the capacitor 20 is formed. Then a second interlayer insulating film 31 of thick oxide film is formed on the entire surface. A contact hole is formed at a prescribed region of the interlayer insulating layer 31 and a bit line 7 is formed therein.

The memory cell of the DRAM is completed through the above described steps. The above described example is one of the means for solving the same problem to be solved by the present invention described later. This method is effective in surely providing prescribed electrostatic capacitance of a capacitor used in an integrated circuit whose degree of integration is to be increased.

SUMMARY OF THE INVENTION

An object of the present invention is to provide a method of manufacturing a stacked capacitor capable of increasing electrostatic capacitance thereof.

Another object of the present invention is to provide a method of manufacturing a stacked capacitor capable of forming a lower electrode layer having a rough surface.

A further object of the present invention is to provide a method of manufacturing a capacitor having a lower electrode with a rough surface by chemical vapor deposition.

A further object of the present invention is to increase electric capacitance of a stacked capacitor.

A first aspect of the present invention relates to a method of manufacturing a semiconductor device comprising a capacitor having a stacked structure of a first electrode layer of silicon layer, a dielectric layer and a second electrode layer on a semiconductor substrate. A silicon layer at a state of transition between poly crystal and amorphous is formed by chemical vapor deposition. Then the dielectric layer is formed on the silicon layer. Then the second electrode layer is formed on the surface of the dielectric layer.

In the second aspect of the present invention, the method of manufacturing a semiconductor device having the capacitor comprises the following steps.

First, a polycrystalline silicon layer including impurities is formed on a semiconductor substrate. Then a silicon layer at a state of transition between poly crystal and amorphous is formed by chemical vapor deposition on the surface of the polycrystalline silicon layer. A dielectric layer is formed on the surface of the silicon layer, and a second electrode layer is formed on the surface of the dielectric layer. Then the semiconductor substrate comprising at least the silicon layer formed thereon is held at a high temperature.

In accordance with the third aspect, the method of manufacturing a semiconductor device having a capacitor comprises the following steps.

First, a silicon layer at a state of transition between poly crystal and amorphous is formed on the semiconductor substrate by chemical vapor deposition. Then a polycrystalline silicon layer including impurities is formed on the surface of the silicon layer. Then a dielectric layer and a second electrode layer are formed on the surface of the polycrystalline silicon layer. Then the semiconductor substrate on which at least the silicon layer and the polycrystalline silicon layer are formed is held at a high temperature.

In accordance with a fourth aspect of the present invention, a semiconductor device having a capacitor comprises a semiconductor substrate of a second conductivity type having a main surface with an impurity region of the first conductivity type formed thereon, an insulating layer formed on the main surface of the semiconductor substrate and having an opening reaching impurities, and a capacitor formed on the semiconductor substrate and on the insulating layer. The capacitor has a stacked structure of a first electrode layer, a dielectric layer and a second electrode layer. The first electrode layer has a first portion formed on the surface of the impurity region and in contact with the insulating layer, and a second portion continuous to the first portion and extending vertically upward from the main surface of the semiconductor substrate, the first and the second portions formed of a silicon layer having a rough surface with concaves and convexes of about 100 nm on the surface thereof.

The first electrode layer of the capacitor is provided by forming a silicon layer by chemical vapor deposition. In chemical vapor deposition, it is found that when a material gas reacts at a certain temperature of dissolution under a certain condition of partial pressure, the provided silicon layer is in a state of transition between polycrystalline structure and amorphous structure. Concaves and convexes of about 100 nm are formed on the surface of such a silicon layer in the transitional state. Therefore, by forming the silicon layer having such rough surface as a lower electrode and by forming the dielectric layer and the second electrode layer on the surface thereof, a capacitor having area of opposition between electrodes increased can be provided.

As a method of providing conductivity to the first electrode layer of the capacitor, a polycrystalline silicon including impurities is formed on the surface or rear surface of a silicon layer having the rough surface provided by chemical vapor deposition and the impurities are thermally diffused from the polycrystalline silicon layer to the silicon layer. Consequently, impurities of a prescribed concentration can be readily introduced to the silicon layer having the rough surface to provide conductivity.

In addition to a stacked structure in which the first electrode layer of the capacitor has a portion projected vertically upward, rough surface is provided on the surface thereof, so that the charge storage capacity of the capacitor can be significantly increased by the multiplied effects.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1A:
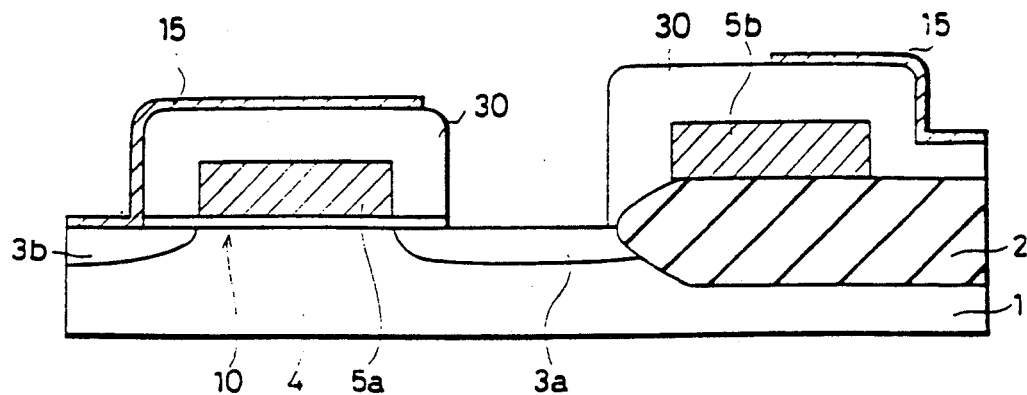
FIGS. 1A, 1B, 1C, 1D, 1E, 1F, 1G and 1H are cross sectional views showing steps of manufacturing a memory cell of a DRAM in accordance with the first embodiment of the present invention.
Figure 1B:
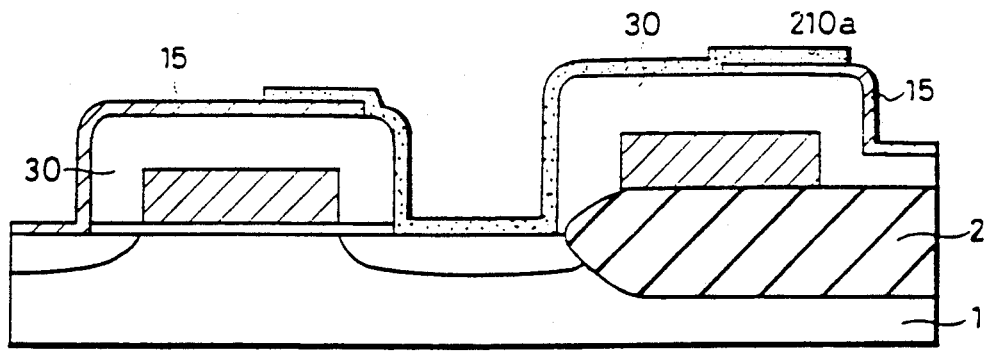
Figure 1C:
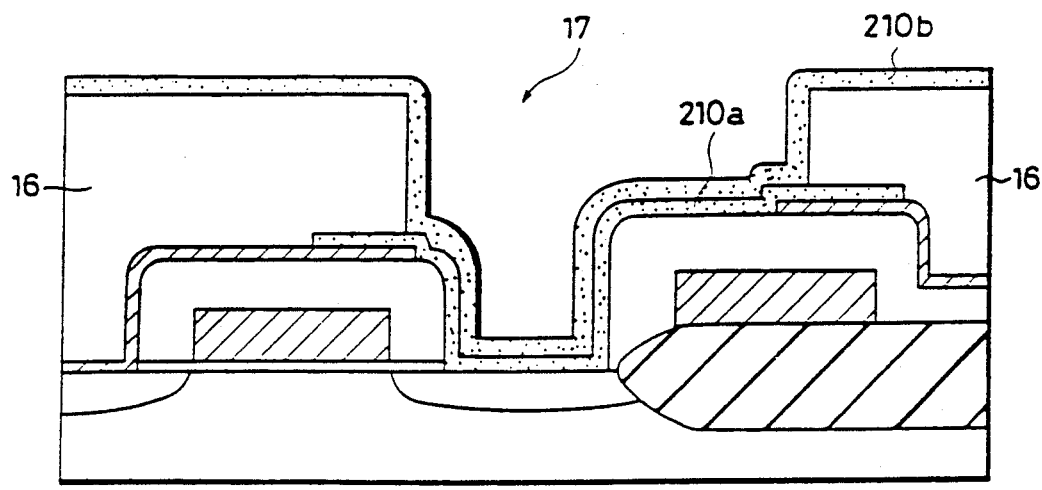
Figure 1D:
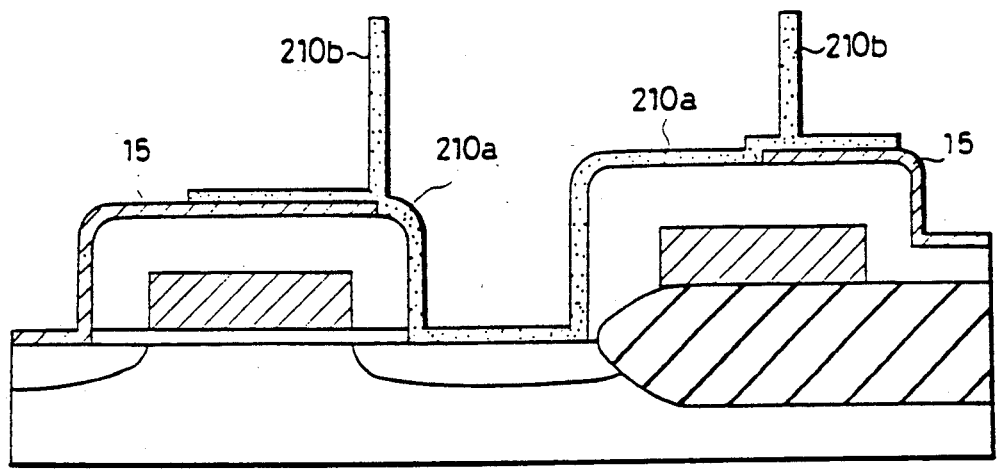
Figure 1E:
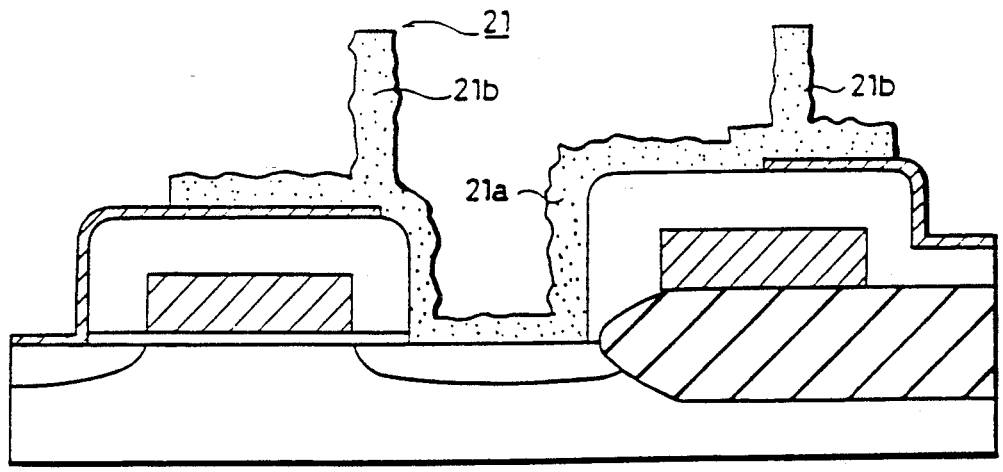
Figure 1F:
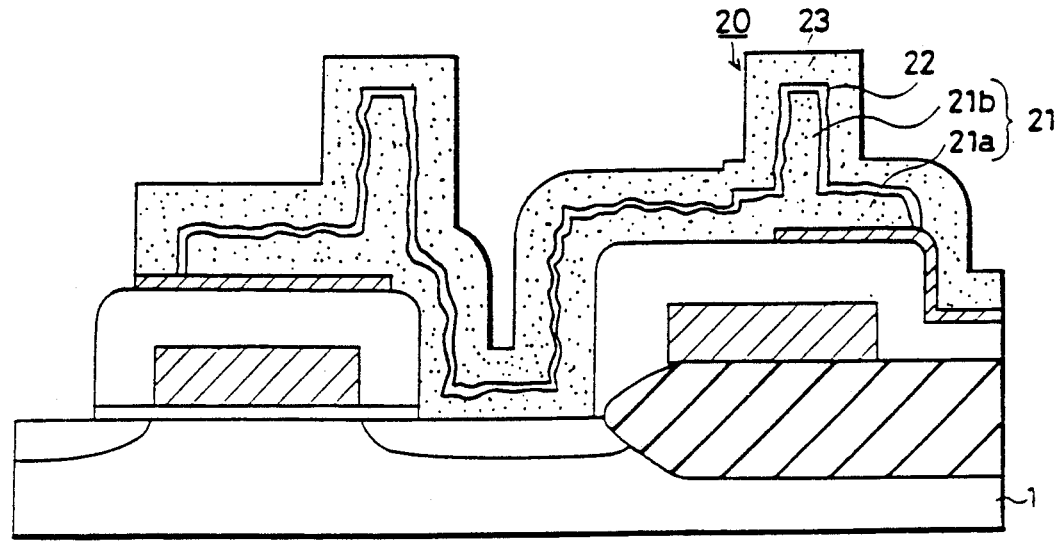
Figure 1G:
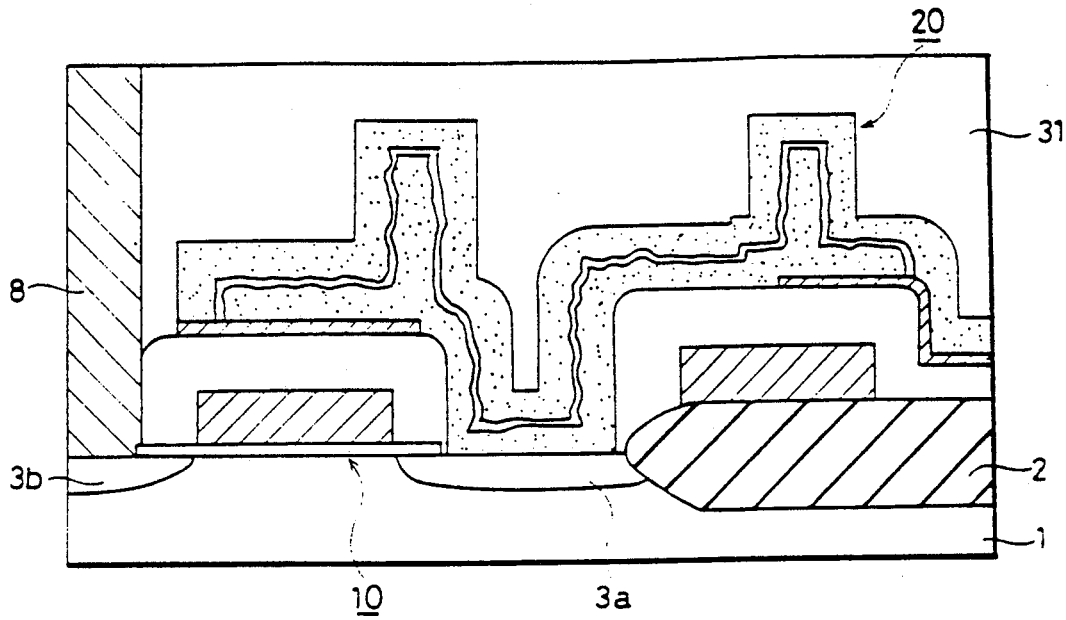
Figure 1H:
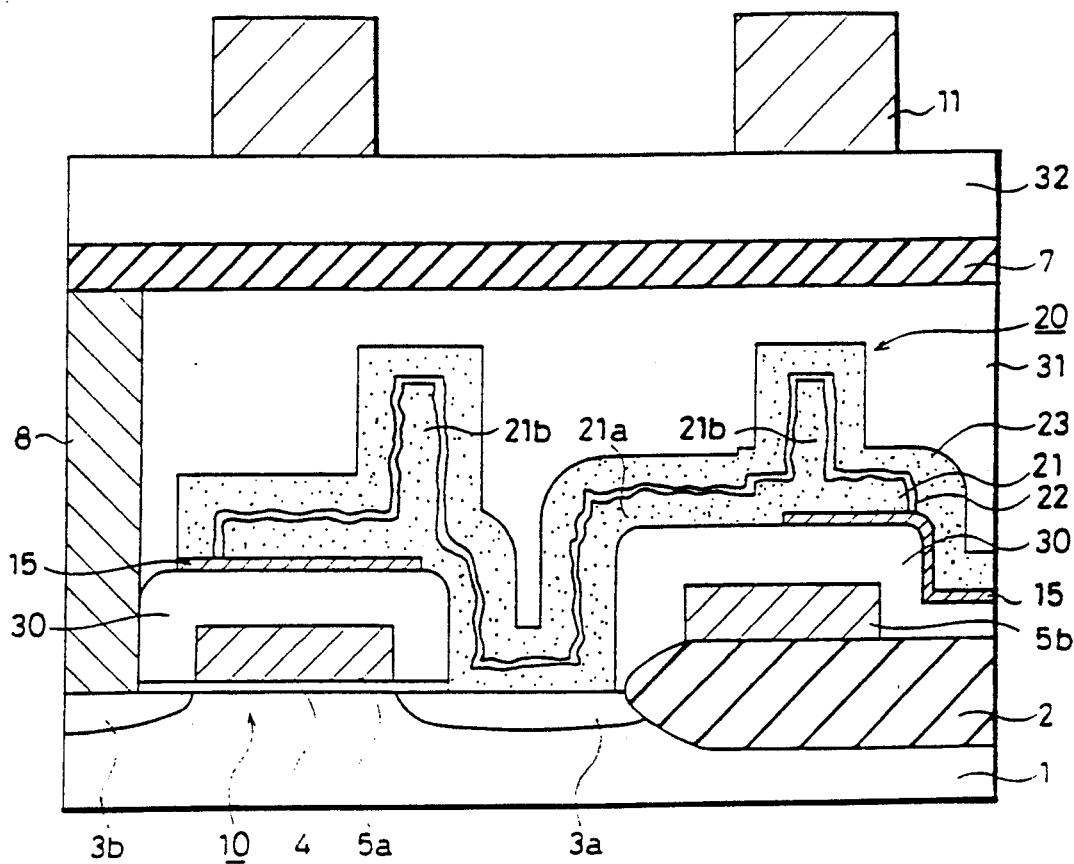

Referring to FIG. 1H, a memory cell comprises one transfer gate transistor 10 and one capacitor 20. The transfer gate transistor 10 comprises a pair of n+ impurity regions 3a and 3b formed spaced apart by a prescribed distance on a surface of a p type silicon substrate, and a gate electrode (word line) 5a formed on the surface of the p type silicon substrate 1 with a thin gate insulating film 4 formed therebetween. A word line 5b is formed on the surface of a field oxide film 2 formed at a prescribed region on the surface of the p type silicon substrate 1. The circumference of the gate electrode 5a and the word line 5b is covered by a first interlayer insulating layer 30. The capacitor 20 is a so-called stacked type capacitor having a stacked structure of a lower electrode 21, a dielectric layer 22 and an upper electrode 23. For convenience of description, the lower electrode 21 comprises two portions. The first portion is a base portion 21a extending from the surface of the gate electrode 5a to an upper portion of the word line 5b with the first interlayer insulating layer 30 posed therebetween. The second portion is a cylindrical portion 21b projecting from the surface of the base portion 21a cylindrically and vertically upward from the main surface of the p type silicon substrate 1. The stacked capacitor having the lower electrode 21 of such a shape is hereinafter referred to as a cylindrical stacked capacitor. The surface of the lower electrode of the cylindrical stacked capacitor has concaves and convexes of about 100 nm formed by the manufacturing method described later. The rough surface increases the opposing area of the lower electrode 21 and the upper electrode 23 opposing each other with the dielectric layer 22 posed therebetween. The dielectric layer 22 comprises a stacked film of a silicon nitride film and a silicon oxide film, and the like. On the surface of the first interlayer insulating layer 30, nitride films 15, 15 used for preventing overetching during the steps of manufacturing are left.

The surface of the stacked capacitor 20 and the like is covered with a thick second interlayer insulating layer 31. A contact hole reaching one n+ impurity region 3b of the transfer gate transistor 10 is formed at a prescribed region of the second interlayer insulating layer 31, and a tungsten plug 8 formed by, for example, selective CVD method is formed in the contact hole. A bit line 7 is positioned on the surface of the second interlayer insulating layer 31 and connected to one n+ impurity region 3b of the transfer gate transistor 10 through the tungsten plug 8. A third interlayer insulating layer 32 is formed above the bit line 7. An interconnection layer 11 having a prescribed shape is formed on the surface of the third interlayer insulating layer.

The method of manufacturing the memory cell of the DRAM in accordance with the first embodiment will be described with reference to FIGS. 1A to 1H.

Referring to FIG. 1A, a thick field oxide film is formed by the LOCOS method on a prescribed region on the surface of a p type silicon substrate. Then a gate oxide film 4 is formed by thermal oxidation on the surface of the p type silicon substrate 1. Then a polycrystalline silicon layer and an insulating layer are stacked entirely on the surface of the p type silicon substrate, and the layers are patterned to have a prescribed shape. Consequently, a gate electrode 5a and a word line 5b are formed. Then impurities are ion implanted to the surface of the p type silicon substrate 1 using the gate electrode 5a as a mask to form n+ impurity regions 3a and 3b. Then an insulating layer is stacked again on the entire surface, and it is selectively removed by anisotropic etching. Consequently, insulating layers are left only on the side walls of the gate electrode 5a and the word line 5b. By this step, the first interlayer insulating layer 30 is formed around the gate electrode 5a and the word line 5b. Then a thin nitride film 15 is formed on the entire surface and is patterned, as shown in FIG. 1A.

Referring to FIG. 1B, a polycrystalline silicon layer 210a is deposited on the entire surface of the p type silicon substrate 1 by low pressure CVD method, and patterned to a prescribed shape.

Referring to FIG. 1C, a thick silicon oxide film 16 is deposited on the surfaces of the polycrystalline silicon layer 210a and the like, and an opening 17 is formed at a prescribed region. The surface of the polycrystalline silicon layer 210a is exposed in the opening 17. The silicon oxide film 16 is used to form the cylindrical portion 21b of the cylindrical stacked capacitor, and the thickness of that portion which is positioned above the polycrystalline silicon layer 210a defines the height of the cylindrical portion 21b of the capacitor. After the opening 17 is formed in the silicon oxide film 16, a polycrystalline silicon layer 210b is deposited to about 50 nm by low pressure CVD method, again on the surface of the silicon oxide film and in the opening 17.

Referring to FIG. 1D, the polycrystalline silicon layer 210b is selectively etched by anisotropic etching. By this etching, the portions of the polycrystalline silicon layer 210b which are positioned on a flat surface of the silicon oxide film 16 and on the surface of flat portions of the polycrystalline silicon layer 210a are selectively removed. Then the polycrystalline silicon layer 210a and the selectively left polycrystalline silicon layer 210b are made integral. Then the silicon oxide film 16 used for forming the cylindrical portion of the cylindrical stacked capacitor is removed by etching. During the step of etching, the silicon nitride film 15 prevents overetching of the first interlayer insulating layer 30 when the silicon oxide film 16 is removed.

Referring to FIG. 1E, the characteristic step of the present invention is done. Namely, in this step a silicon layer is formed on the surfaces of the polycrystalline silicon layers 210a and 210b serving as a frame of the lower electrode of the capacitor by the low pressure CVD method. This step of forming the silicon layer is carried out by using, for example, a horizontal low pressure chemical vapor deposition apparatus. The p type silicon substrate 1 positioned in a reaction tube of the apparatus is heated to a prescribed temperature, for example about 577° C. by a heater under reduced pressure. Then a material gas is introduced to the reaction tube. Monosilane gas or monosilane gas diluted by nitride or helium is used as the material gas. The partial pressure of monosilane gas is about 10 to 50 Pa, and it is 30 Pa in this example. In this state, monosilane ($SiH_4$) reacts to be ($Si + 2H_2$) by thermal decomposition, and a silicon film is formed entirely on the surface of the p type silicon substrate 1.

Figure 7:
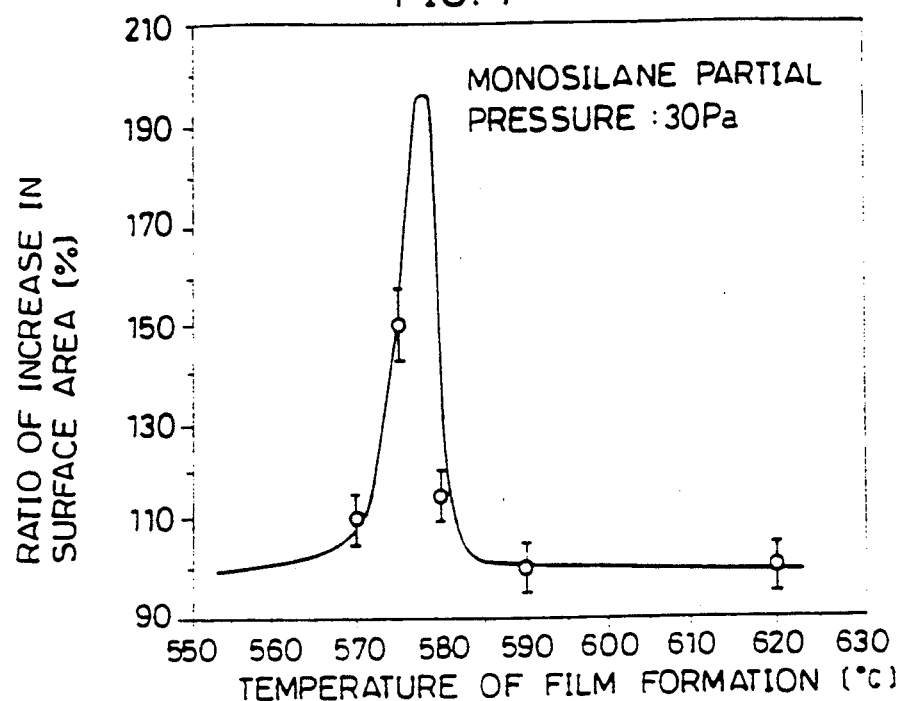
FIG. 7 shows a relation between the temperature of forming a silicon film provided by low pressure CVD method and ratio of increase of surface area of the present invention.
Figure 8:
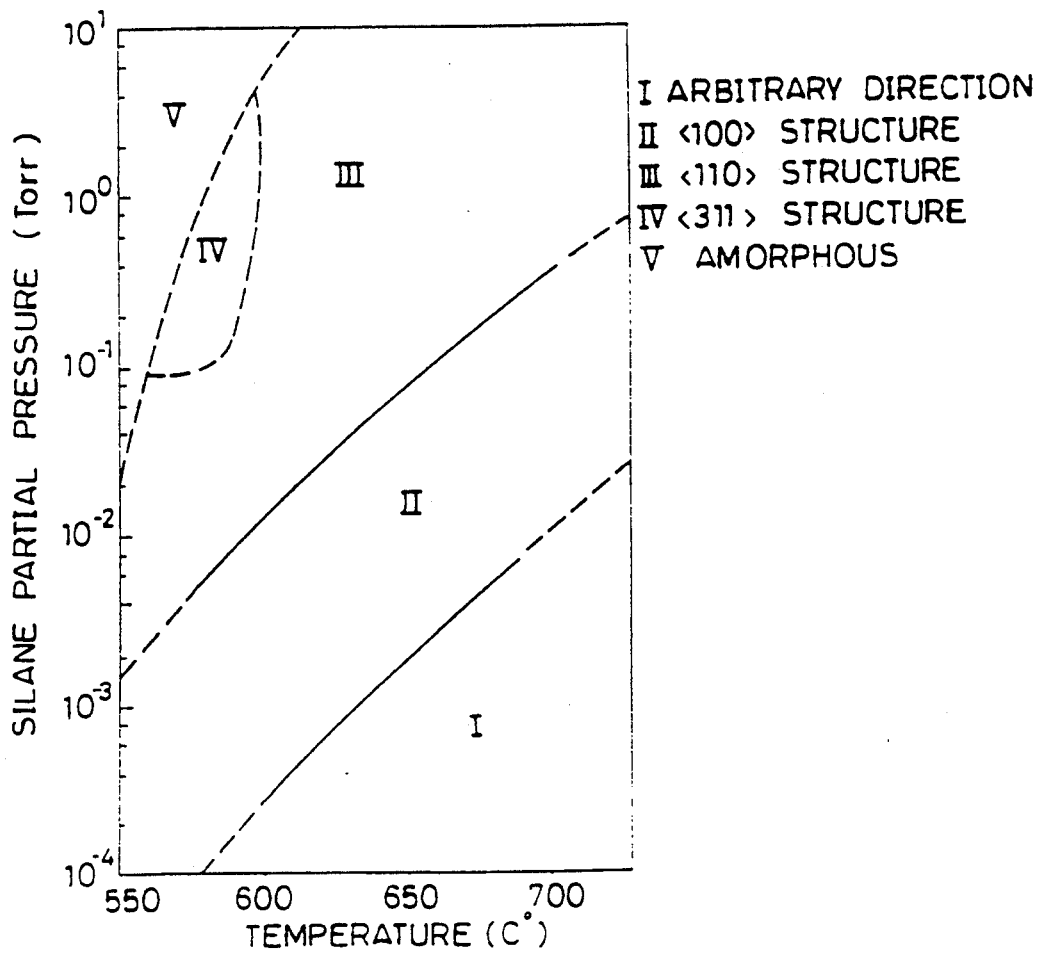
FIG. 8 shows classification of crystal structure of the silicon layer dependent on the formation temperature and silane partial pressure.
Figure 9A:
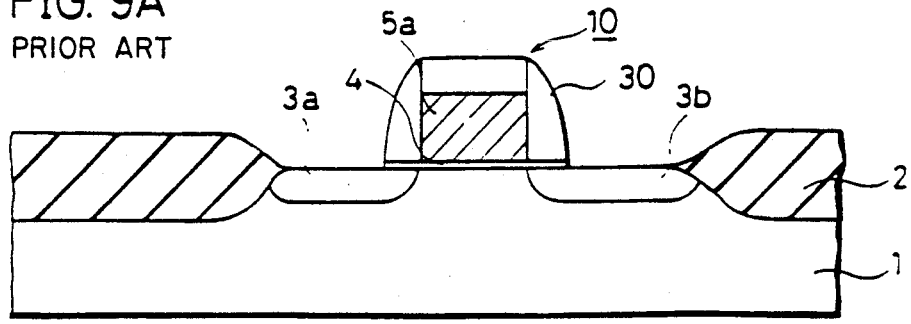
FIGS. 9A, 9B, 9C and 9D are cross sectional views showing the o manufacturing a memory cell of a conventional DRAM.
Figure 9B:
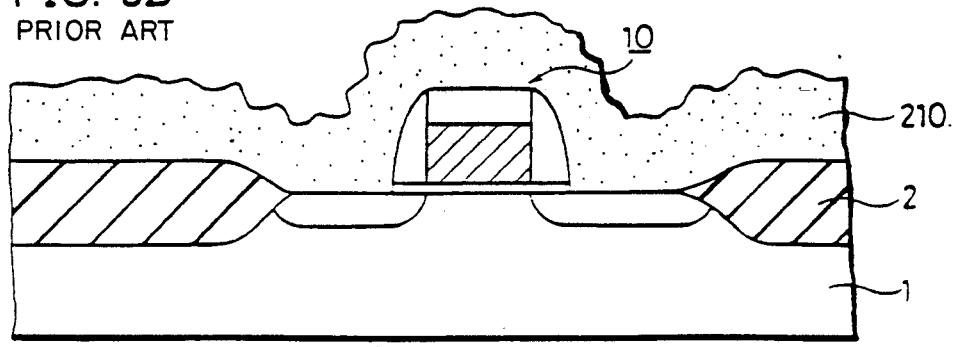
Figure 9C:
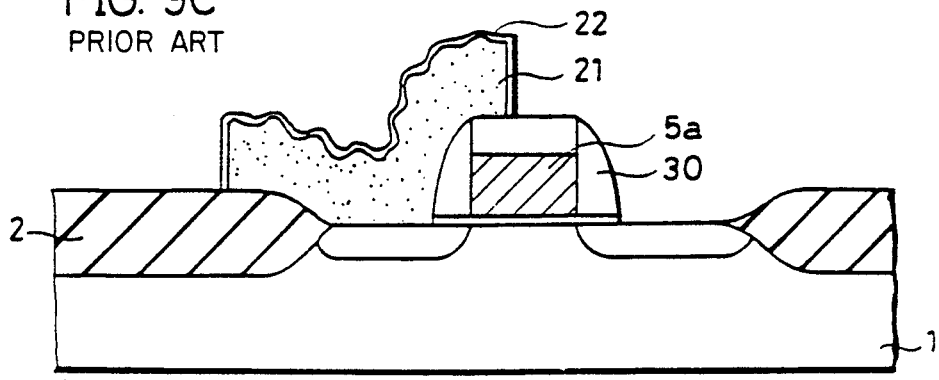
Figure 9D:
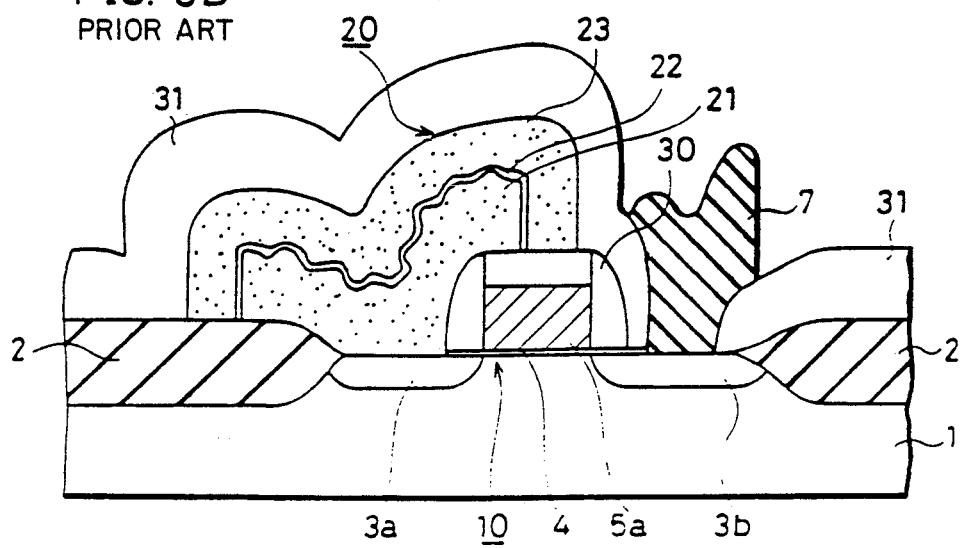

The characteristic of the silicon film formed under the above described condition of temperature and partial pressure will be described. FIG. 8 is a graph showing the crystal structure of the silicon film formed by the CVD method, in accordance with the relation between the temperature and the silane partial pressure. This graph is shown in "The Effect of Low Pressure on the Structure of LPCVD Polycrystalline Silicon Films"; P. Joubert et al., J. Electrochem. Soc. SOLID-STATE SCIENCE AND TECHNOLOGY Oct. 1987. As is apparent from the graph, the crystal structure of a silicon film formed under a certain condition by the low pressure CVD method, is divided into the polycrystalline structure, amorphous and a transitional state therebetween dependent on the silane partial pressure and the temperature of formation. The inventors carried out various experiments with the temperature and the silane partial pressure changed parametrically, paying attention to the surface shape of the silicon film. Consequently, it is found that conspicuous concaves and convexes are formed on the surface of the silicon film when the state of the silicon film is at the transitional region between poly crystal and amorphous. For example, when silane is decomposed at the temperature of about 580° C. to form the silicon layer, approximately 30 to 100 concaves and convexes of about 100 nm are formed per 1 square micron on the surface of the silicon layer. FIG. 7 shows increase of surface area of the silicon film having such concaves and convexes. In this figure, the monosilane partial pressure is set at 30 Pa and the ratio of increase of the surface area of the silicon film is shown with the forming temperature changed variously. As is apparent from the figure, the surface area is significantly increased at the temperature of 570° to 590° C.

By the above described low pressure CVD method, a silicon film having a rough surface is formed on the surfaces of the polycrystalline silicon layers 210a and 210b. By ion implantation of phosphorus (P) or arsenic (As), n type impurities for providing conductivity to the silicon layer are introduced. Then the silicon layer is patterned to a prescribed shape by photolithography and etching. The lower electrode 21 of the capacitor is thus formed.

Referring to FIG. 1F, a silicon nitride film is deposited by the CVD method on the surface of the lower electrode 21. Then the surface of the silicon nitride film is thermally oxidized to provide a silicon oxide film. Consequently, the dielectric layer 22 of a multilayer film of a silicon nitride film and a silicon oxide film is formed. The thickness of the dielectric layer 22 is about 5 to 6 nm in oxide film equivalent. Then an upper electrode 23 of polycrystalline silicon layer is formed on the surface of the dielectric layer 22.

Referring to FIG. 1G, a second thick interlayer insulating film 31 is formed entirely on the surface of the p type silicon substrate, and a contact hole is formed at a prescribed region. Then a metal such as tungsten (W) is filled in the contact hole by, for example, selective CVD method, to form a bit line contact 8.

Referring to FIG. 1H, a bit line 7 is formed on the surface of the second interlayer insulating layer 31. Further, a third interlayer insulating layer 32 is formed on the bit line 7 and the like. Then an interconnection layer 11 is formed on the surface of the third interlayer insulating layer 32. Thus the process of manufacturing a memory cell having a cylindrical stacked capacitor is completed.

The silicon layer of the lower electrode 21 is subjected to the influence of heat during the succeeding steps to be turned into a polycrystalline state. However, the rough shape of the boundary between the lower electrode 21 and the dielectric layer 22 is maintained.

A second embodiment of the present invention will be described. Compared with the first embodiment, the step of introducing impurities to the lower electrode of the capacitor is modified in the second embodiment.

Figure 2A:
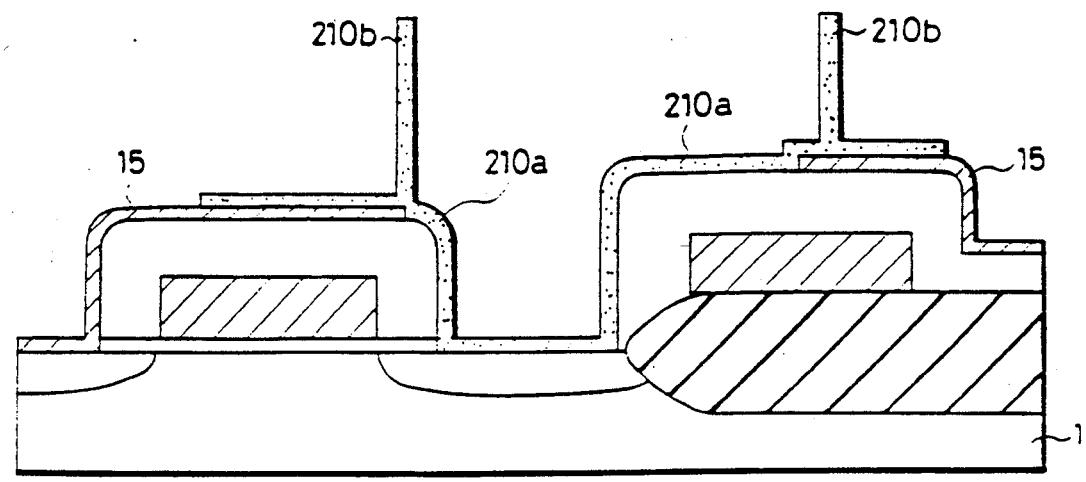
FIGS. 2A and 2B are cross sectional views showing main steps of manufacturing a memory cell of a DRAM in accordance with the second embodiment of the present invention.

FIG. 2A shows a cross sectional structure of a memory cell formed through the process steps corresponding to FIGS. 1A to 1D. The polycrystalline silicon layers 210a and 210b to form the lower electrode 21 of the capacitor are deposited to have the thickness of about 50 nm by low pressure chemical vapor deposition using silane and phosphine at the temperature of about 560° to 620° C. By this step, the polycrystalline silicon layers 210a and 210b are formed to have prescribed shapes including $7 \times 10^{20}/cm^3$ of phosphorus therein, for example.

Figure 2B:
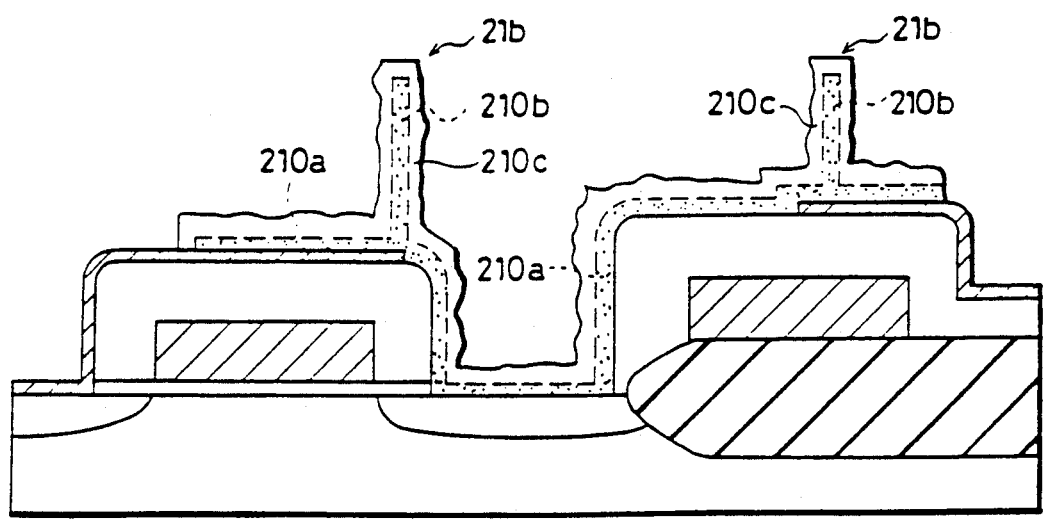

Referring to FIG. 2B, a silicon layer 210c is formed by the CVD method entirely over the silicon substrate. The silicon layer 210c is formed under the same condition as in the first embodiment to be in the transitional state between amorphous and poly crystal. Therefore, considerable concaves and convexes are formed on the surface thereof. In this state with the silicon layer 210c deposited, impurities for providing conductivity are not included in the silicon layer 210c.

Then, impurities, for example phosphorus are introduced by diffusion from the previously formed polycrystalline silicon layers 210a and 210b to the silicon layer 210c by thermal diffusion. The lower electrode 21 as a whole of the capacitor thus comes to have the impurity concentration of about $2$ to $4 \times 10^{20}/cm^3$. Consequently, the lower electrode 21 as a whole of the capacitor becomes conductive. The process of thermal diffusion from the polycrystalline silicon layers 210a and 210b to the silicon layer 210c may be carried out as an independent step of thermal processing for thermal diffusion of impurities, or thermal diffusion may be carried out incidentally through heating during the succeeding steps of thin film formation and thermal processing. In the former case, the condition of thermal processing is, for example, thermal processing at 850° C. for about 30 minutes. In the latter case, it is not necessary to carry out an independent step of thermal processing for impurity diffusion, and therefore the manufacturing process can be made easier.

A third embodiment of the present invention will be described. As in the second embodiment, the step of providing conductivity to the lower electrode 21 of the capacitor is modified in the third embodiment.

Figure 3A:
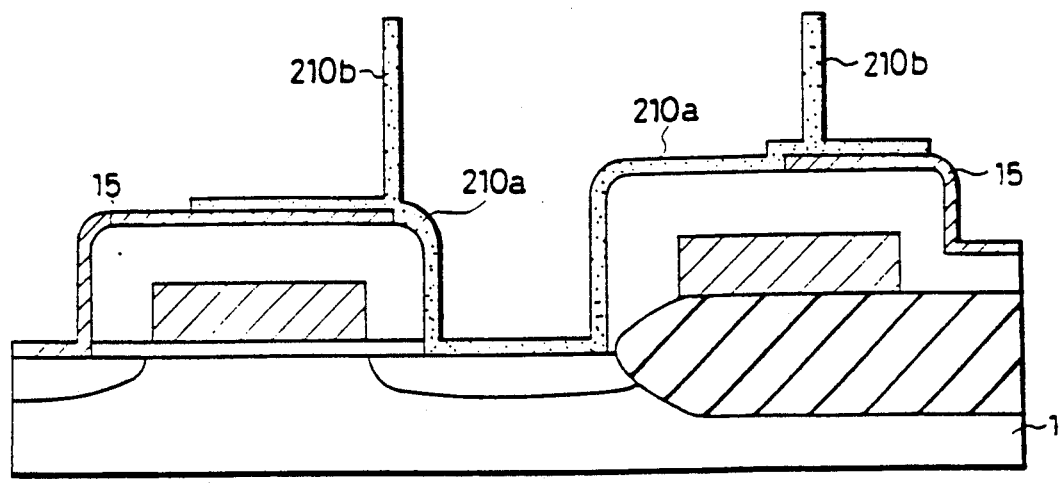
FIGS. 3A, 3B, 3C and 3D are cross sectional views showing main steps of manufacturing a memory cell in accordance with the third embodiment of the present invention.

Referring to FIG. 3A, the same step as shown in FIG. 2A is carried out in this step.

Figure 3B:
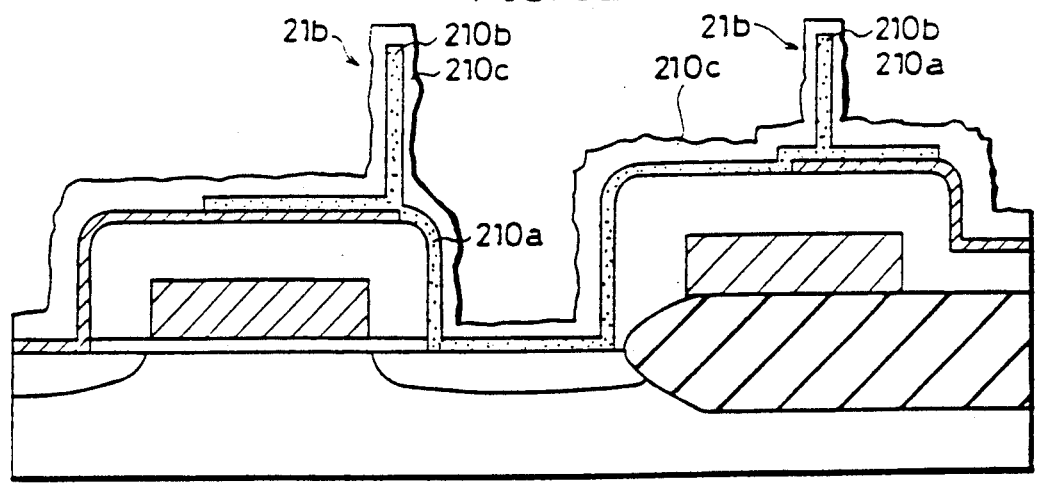

Referring to FIG. 3B, a silicon layer 210c which is at the transitional state between poly crystal and amorphous is formed by chemical vapor deposition on the entire surface of the silicon substrate having the polycrystalline silicon layers 210a and 210b and the like formed thereon. Large concaves and convexes are formed on the surface of the silicon layer 210c.

Figure 3C:
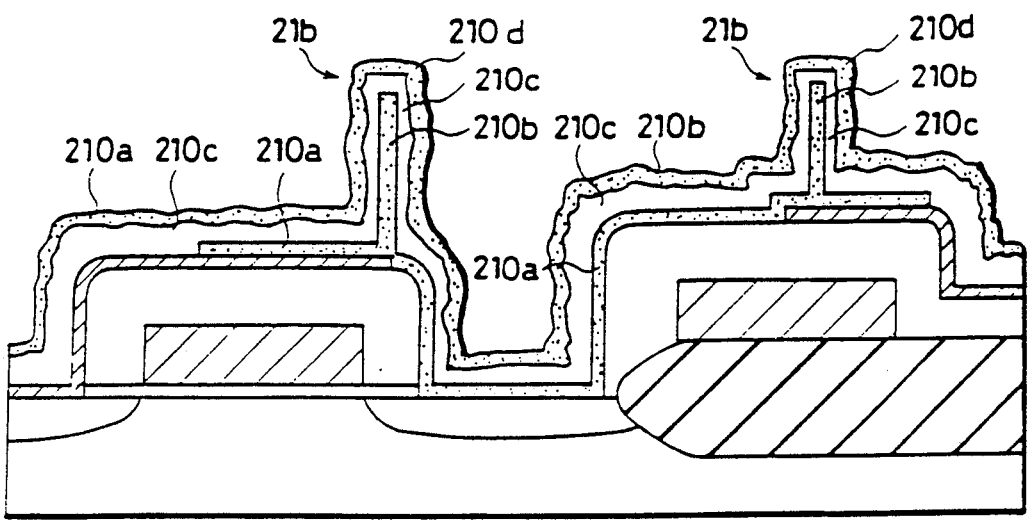

Referring to FIG. 3C, a polycrystalline silicon layer 210d with phosphorus doped is deposited to the thickness of about 50 nm by low pressure CVD method using silane and phosphine.

As described in the second embodiment, thermal processing step is carried out and phosphorus is diffused to the silicon layer 210c from the phosphorus doped polycrystalline silicon layers 210a, 210b and from the surface of 210c. Thus the lower electrode 21 of the capacitor becomes conductive.

Figure 3D:
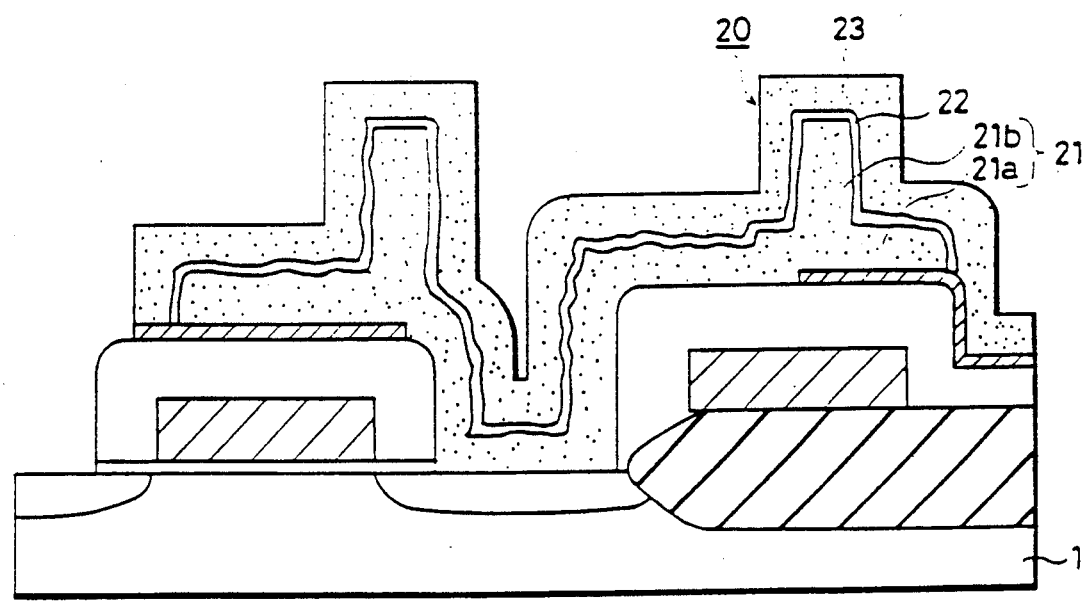

The polycrystalline silicon layers 210a and 210b shown in FIG. 3A may be formed by using non-doped polycrystalline silicon layer. The impurities for providing conductivity may be arsenic (As) or the like. Then, as shown in FIG. 3D, a dielectric layer 22 formed of a multilayer film of a silicon nitride film and the silicon oxide film is formed on the surface of the lower electrode 21 of the capacitor. Then an upper electrode 23 of polycrystalline silicon layer including impurities is formed further thereon to be patterned to a prescribed shape.

Then the steps following the step shown in FIG. 1G are carried out to complete the memory cell of the DRAM.

A fourth embodiment of the present invention will be described. FIG. 4G is a cross sectional view of a memory cell in accordance with the fourth embodiment. Compared with the memory cell of the first embodiment, the fourth embodiment shows a typical stacked type capacitor. Namely, a portion of the lower electrode 21 of the capacitor 20 extends above the gate electrode 5a with an insulating layer posed therebetween, and the other end thereof extends above a word line 5b passing over a field oxide film 2, with an insulating layer formed therebetween. A portion of the lower electrode 21 is connected to one n+ impurity region 3b of a transfer gate transistor 10. The lower electrode 21 has a rough surface formed by the low pressure CVD method in accordance with the present invention.

The method of manufacturing the memory cell in accordance with the fourth embodiment will be described with reference to FIGS. 4A to 4G. FIGS. 4A to 4G are cross sectional views showing steps of manufacturing the memory cell in this order.

Figure 4A:
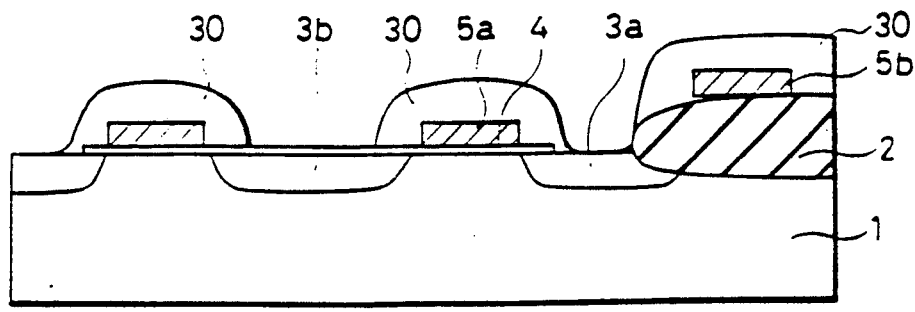
FIGS. 4A, 4B, 4C, 4D, 4E, 4F and 4G are cross sectional views showing the steps of manufacturing a memory cell of a DRAM in accordance with the fourth embodiment of the present invention.

Referring to FIG. 4A, a transfer gate transistor 10 and a word line 5b are formed on a surface of a p type silicon substrate 1 by the same method as shown in FIG. 1A. A nitride film is not formed.

Figure 4B:
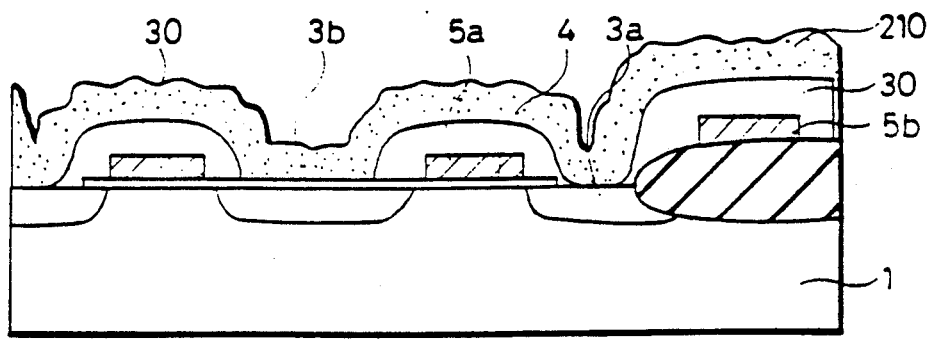
Figure 4C:
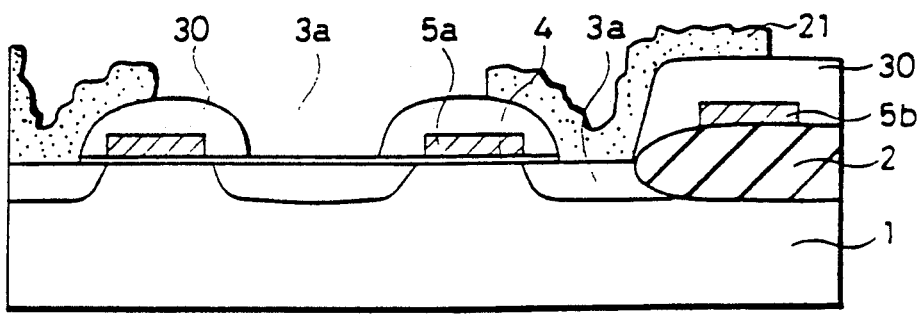

Referring to FIG. 4B, a silicon layer 210 is formed entirely on the surface of the p type silicon substrate by the low pressure CVD method. The conditions of the low pressure CVD method are the same as those of the first embodiment and, for example, silane is thermally decomposed at the temperature of 580° C. to provide a silicon layer 210 having the thickness of about 200 nm. Concaves and convexes of about 100 nm are formed on the surface of the silicon layer 210.

Then n type impurities are introduced to the silicon film 210 by ion implantation of phosphorus or arsenic.

Then, as shown in FIG. 2, the silicon film 210 is patterned to a prescribed shape by photolithography and etching. Thus the lower electrode 21 of the capacitor having a rough surface is provided.

Figure 4D:
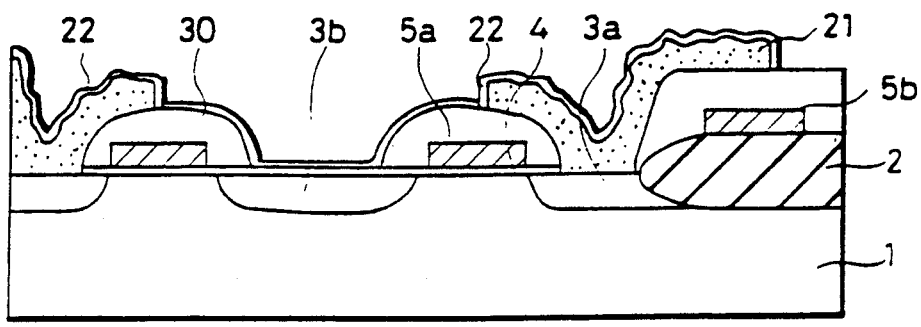

Referring to FIG. 4D, a dielectric layer 22 formed of, for example, a stacked film of a silicon nitride film and a silicon oxide film is formed by the low pressure CVD method.

Figure 4E:
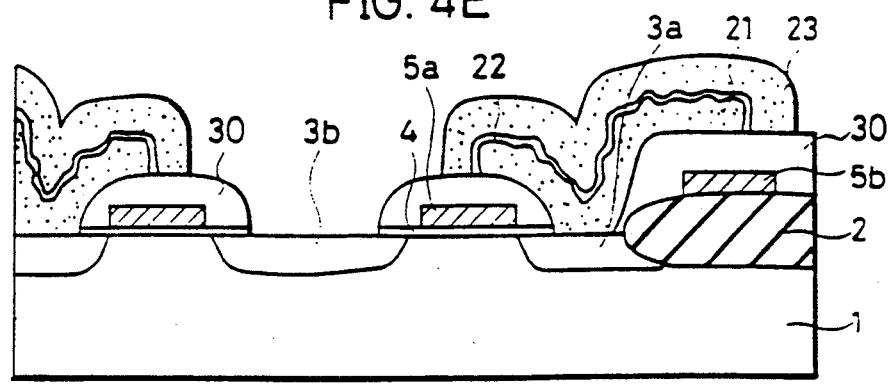

Then, referring to FIG. 4E, the dielectric layer 22 is patterned to a prescribed shape, and an upper electrode 23 of polycrystalline silicon layer is formed thereon.

Figure 4F:
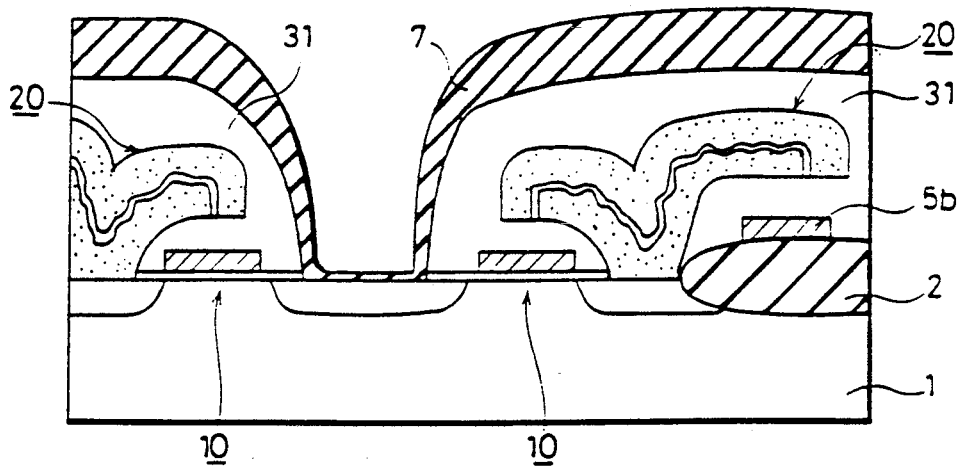
Figure 4G:
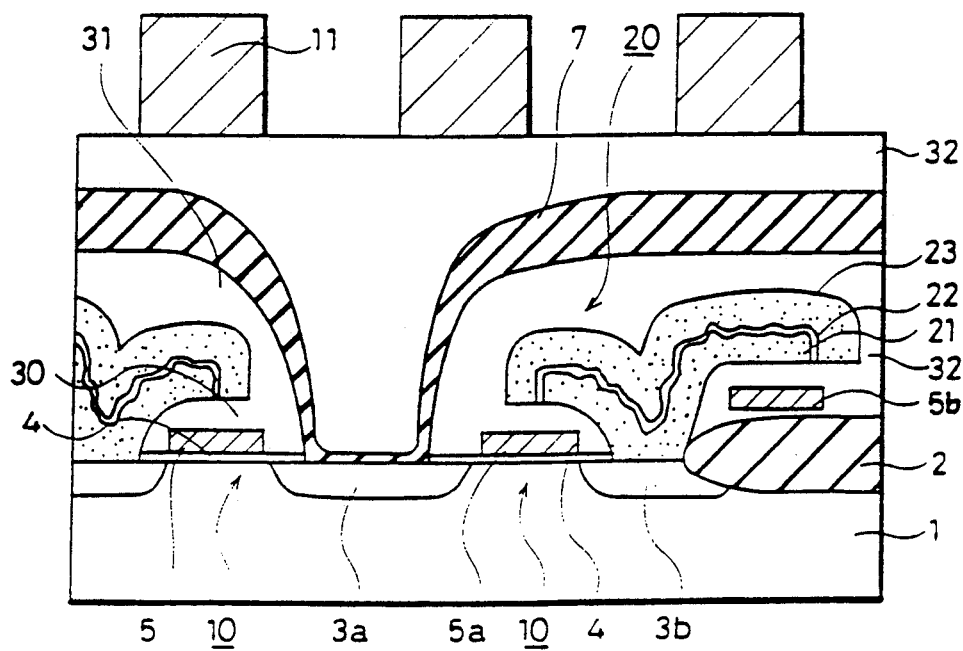

Then, referring to FIG. 4F, the surface of the p type silicon substrate 1 having the capacitor 20 and the like formed thereon is covered by a second interlayer insulating layer 31, and a contact hole is opened at a prescribed region. A bit line 7 is formed in the contact hole and on the surface of the second interlayer insulating layer 31.

Referring to FIG. 4G, the surface of the bit line 7 and the like is covered by the third interlayer insulating layer 32. Then an interconnection layer 11 having a prescribed shape is formed on the surface of the third interlayer insulating layer 32.

A fifth embodiment of the present invention will be described. The fifth embodiment corresponds to the second embodiment described above, in which conductivity is provided to the lower electrode 21 of the stacked capacitor by thermal diffusion.

Figure 5A:
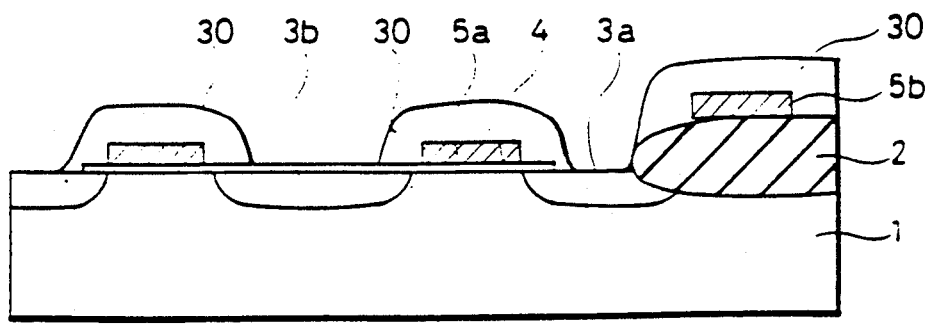
FIGS. 5A, 5B and 5C are cross sectional views showing main steps of manufacturing a memory cell of a DRAM in accordance with the fifth embodiment of the present invention.

Referring to FIG. 5A, a prescribed transfer gate transistor is formed on a surface of a p type silicon substrate.

Figure 5B:
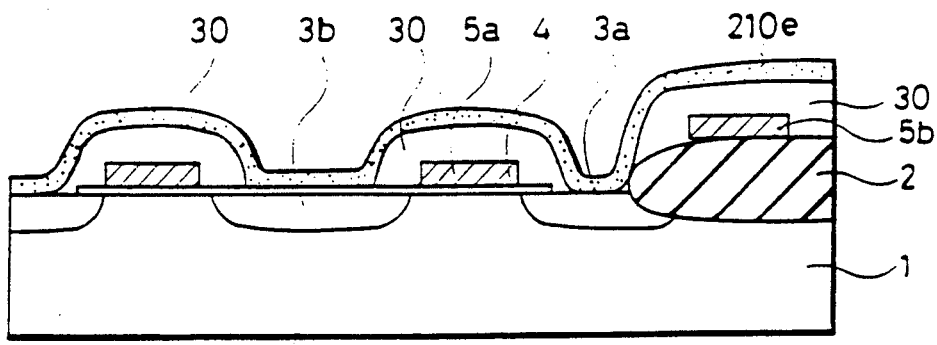

Referring to FIG. 5B, a polycrystalline silicon layer 210e with phosphorus doped is deposited by the low pressure CVD method on the entire surface of the p type silicon substrate 1.

Figure 5C:
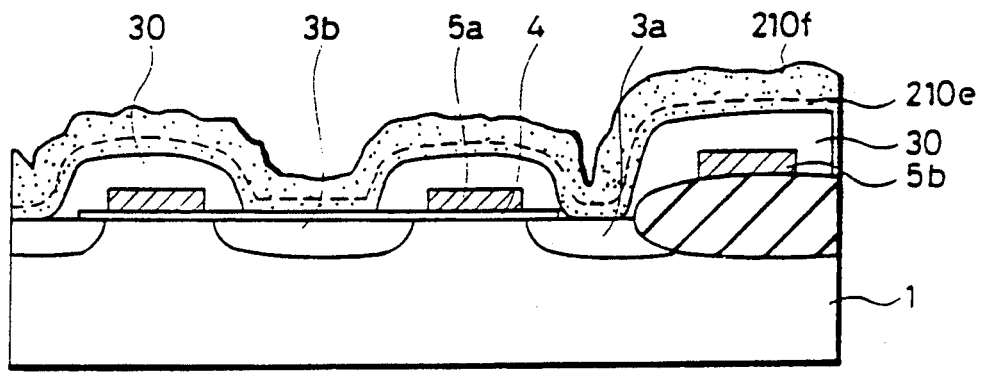

Referring to FIG. 5C, a silicon layer 210f having a rough surface is deposited on the surface of the phosphorus doped polycrystalline silicon layer 210e.

Then an independent step of thermal diffusion is carried out for thermally diffusing impurities (phosphorus) included in the polycrystalline silicon layer 210e to the silicon layer 210f. Consequently, the lower electrode 21 of the capacitor becomes conductive.

Alternatively, the impurities in the polycrystalline silicon layer 210e may be diffused to the silicon layer 210f not by the independent step of thermal processing but during the succeeding steps of thin film formation and thermal processing.

Then steps following FIG. 4C are carried out.

Figure 6A:
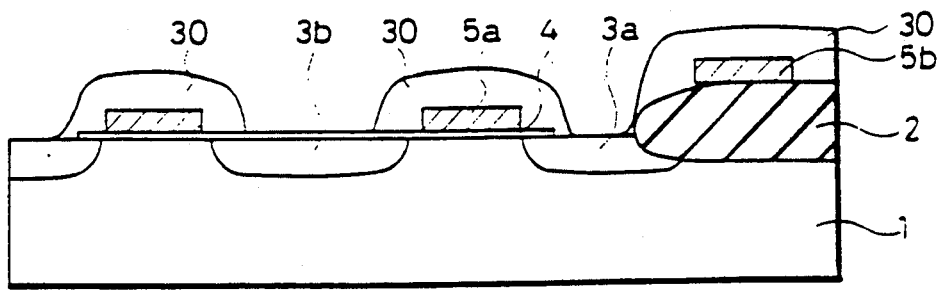
FIGS. 6A, 6B and 6C are cross sectional views showing main steps of manufacturing a memory cell of a DRAM in accordance with embodiment of the present invention.
Figure 6B:
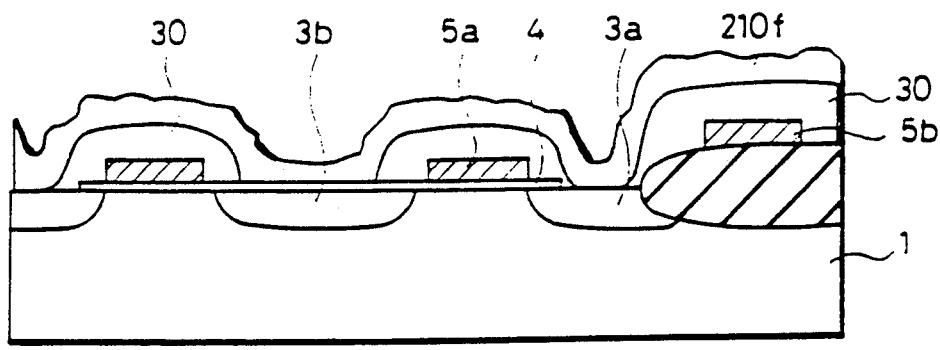
Figure 6C:
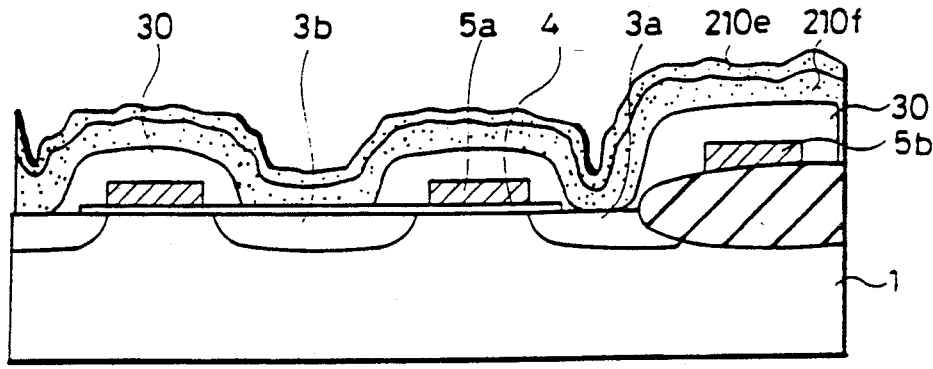

A sixth embodiment of the present invention will be described. The sixth embodiment corresponds to the third embodiment, and is a modification of the fifth embodiment. More specifically, referring to FIGS. 6A to 6C, a silicon layer 210f having a rough surface is formed entirely on the surface of the silicon substrate 1. Then the polycrystalline silicon layer 210e including phosphorus is formed by the low pressure CVD method. Then thermal processing is carried out to thermally diffuse impurities from the polycrystalline silicon layer 210e to the silicon layer 210f.

Then the steps following FIG. 4C are carried out.

As described above, in the first to sixth embodiment, by setting the temperature of reaction of the low pressure CVD method and the silane partial pressure at prescribed values, the silicon film can be formed to be in the transitional state between amorphous and poly crystal. The temperature range is about 560° to 600° according to the results of various experiments, and the partial pressure of silane ($SiH_4$) is 10 to 50 Pa. The silicon layer formed under such conditions has concaves and convexes of about 100 nm formed on the surface thereof. It is observed that about 30 to 100 concaves and convexes are formed per 1 square micron. Consequently, the surface area of the silicon layer is increased by about 130 to 200% compared with that of the polycrystalline silicon film formed at the normal temperature not lower than 600° C. Consequently, the opposing areas of the electrodes of the capacitor is increased, increasing the capacitance of the capacitor.

Further, when impurities are introduced to the silicon layer having the rough surface by thermal diffusion as shown in the second, third, fifth and sixth embodiments, damage to the underlying layer which may be caused by ion implantation can be prevented.

Although the upper electrode 23 is formed of polycrystalline silicon in the above described embodiments, the upper electrode 23 may be formed of a high melting point metal silicide film, or a composite film of a polycrystalline silicon film and a high melting point metal silicide film. Not only the nitride film by the low pressure CVD method but also a metal oxide film such as tantalum pentoxide film may be used as the dielectric film.

As described above, in the method of manufacturing the semiconductor device in accordance with the present invention, the lower electrode of the capacitor is formed by the low pressure CVD method. Further, the low pressure CVD method is carried out under the condition to have the resulting silicon layer be in the transitional region between amorphous and poly crystal, so that conspicuous concaves and convexes are formed on the surface of the silicon layer. Consequently, the opposing area between electrodes of the capacitor is increased, enabling manufacturing of capacitors having large capacitance. Since the planar area of occupation of the capacitor is not increased, the degree of integration of the semiconductor device can be improved. In addition, it is not necessary to add a new step to the conventional manufacturing method, and therefore the manufacturing process does not become complicated.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing on a semiconductor substrate a stacked capacitor, comprising the steps of:
   forming on said substrate a first electrode layer including transitional silicon in a transitional state between poly crystal and amorphous;
   forming a dielectric layer on a surface of said first electrode layer; and
   forming a second electrode layer on a surface of said dielectric layer.

2. A method of manufacturing as recited in claim 1, wherein
   said step of forming said first electrode layer comprises performing chemical vapor deposition in the presence of monosilane gas.

3. A method of manufacturing as recited in claim 2, wherein
   said chemical vapor deposition is performed while maintaining partial pressure of said monosilane gas in a range between 10 Pa and 50 Pa, and
   reaction temperature of said silicon is maintained in a range between 560° C. and 600° C.

4. A method of manufacturing on a semiconductor substrate a stacked capacitor, comprising the steps of:
   forming a polycrystalline silicon layer including impurities on said semiconductor substrate;
   forming a silicon layer in a transitional state between poly crystal and amorphous on a surface of said polycrystalline silicon layer;
   forming a dielectric layer on a surface of said silicon layer;
   forming an electrode layer on a surface of said dielectric layer; and
   by maintaining said semiconductor substrate having at least said silicon layer formed thereon at a high temperature, diffusing the impurities in said polycrystalline silicon layer to said silicon layer.

5. A method of manufacturing as recited in claim 4, wherein the step of forming said silicon layer comprises performing chemical vapor deposition in the presence of monosilane gas.

6. A method of manufacturing a stacked type capacitor according to claim 5, wherein
   said chemical vapor deposition is performed while maintaining partial pressure of said monosilane gas in a range between 10 Pa and 50 Pa, and
   reaction temperature of said silicon layer is maintained in a range between 560° C. and 600° C.

7. A method of manufacturing on a semiconductor substrate a stacked capacitor, comprising the steps of:
   forming a silicon layer in a transitional state between poly crystal and amorphous on said semiconductor substrate;
   forming a polycrystalline silicon layer including impurities on a surface of said silicon layer;
   forming a dielectric layer on a surface of said polycrystalline silicon layer;
   forming an electrode layer on a surface of said dielectric layer; and
   by maintaining said semiconductor substrate having at least said silicon layer and said polycrystalline silicon layer formed thereon at a high temperature, diffusing said impurities in said polycrystalline silicon layer to said silicon layer.

8. A method of manufacturing a stacked type capacitor according to claim 7, wherein said step of forming said silicon layer comprises performing chemical vapor deposition in the presence of monosilane gas.

9. A method of manufacturing a stacked type capacitor according to claim 8, wherein
   said chemical vapor deposition is performed while maintaining partial pressure of said monosilane gas in a range between 10 Pa and 50 Pa, and
   reaction temperature of said silicon layer is maintained in a range between 560° C. and 600° C.

10. A method of manufacturing on a semiconductor substrate a stacked capacitor, comprising the steps of:
    forming an impurity region on a main surface of said semiconductor substrate;

forming a first insulating layer having a first opening reaching said impurity region on the main surface of said semiconductor substrate;

forming a first polycrystalline silicon layer on a surface of said first insulating layer, in said first opening and on a surface of said impurity region and patterning the same to a prescribed shape;

forming a second insulating layer entirely on the surface of said semiconductor substrate;

forming a second opening reaching said first polycrystalline silicon layer in said second insulating layer;

forming a second polycrystalline silicon layer on a surface of said second insulating layer and in said second opening;

patterning said second polycrystalline silicon layer to leave said second polycrystalline silicon layer on side walls of said second opening;

after removing said second insulating layer, forming a silicon layer in a transitional state between poly crystal and amorphous on the surfaces of said first and second polycrystalline silicon layers;

forming a dielectric layer on the surface of said silicon layer; and forming an electrode layer on a surface of said dielectric layer.

11. A method of manufacturing a stacked type capacitor according to claim 10, wherein the step of forming said silicon layer comprises performing chemical vapor deposition in the presence of monosilane gas.

12. A method of manufacturing a stacked type capacitor according to claim 11, wherein said chemical vapor deposition is preformed while maintaining partial pressure of said monosilane gas in a range between 10 Pa and 50 Pa, and reaction temperature of said silicon layer is maintained in a range between 560° C. and 600° C.

13. A method of manufacturing on a semiconductor substrate a stacked capacitor, comprising the steps of:

forming an impurity region on a main surface of said semiconductor substrate;

forming a first insulating layer having a first opening reaching said impurity region on the main surface of said semiconductor substrate;

forming a first polycrystalline silicon layer on a surface of said first insulating layer, in said first opening and on a surface of said impurity region and patterning the same to a prescribed shape;

forming a second insulating layer entirely on the surface of said semiconductor substrate;

forming a second opening reaching a surface of said first polycrystalline silicon layer in said second insulating layer;

forming a second polycrystalline silicon layer on a surface of said second insulating layer and in said second opening;

patterning said second polycrystalline silicon layer to leave said second polycrystalline silicon layer on side walls of said second opening;

after removing said second insulating layer, forming a silicon layer in a transitional state between poly crystal and amorphous on the surfaces of said first and second polycrystalline silicon layers;

forming a third polycrystalline silicon layer on a surface of said silicon layer;

forming a dielectric layer on the surface of said third polycrystalline silicon layer;

forming an electrode layer on a surface of said dielectric layer.

14. A method of manufacturing a stacked type capacitor according to claim 13, wherein the step of forming said silicon layer comprises performing chemical vapor deposition in the presence of monosilane gas.

15. A method of manufacturing a stacked type capacitor according to claim 14, wherein said chemical vapor deposition is preformed while maintaining partial pressure of said monosilane gas in a range between 10 Pa and 50 Pa, and reaction temperature of said silicon layer is maintained in a range between 560° C. and 600° C.

16. A method of manufacturing as recited in claim 4, wherein said step of forming said first electrode layer comprises introducing impurities into said transitional silicon.

17. A method of manufacturing as recited in claim 16, wherein said step of introducing impurities comprises forming a doped layer including impurities in contact with said transitional silicon and diffusing said impurities into said silicon.

18. A method of manufacturing as recited in claim 17, wherein said doped layer is formed prior to forming said transitional silicon.

19. A method of manufacturing as recited in claim 17, wherein said transitional silicon is formed prior to forming said doped layer.

20. A method of manufacturing as recited in claim 10, wherein said step of forming said first electrode layer comprises introducing impurities into said transitional silicon.

21. A method of manufacturing as recited in claim 20, wherein said step of introducing impurities comprises forming a doped layer including impurities in contact with said transitional silicon and diffusing said impurities into said silicon.

22. A method of manufacturing as recited in claim 21, wherein said doped layer is formed prior to forming said transitional silicon.

23. A method of manufacturing as recited in claim 21, wherein said transitional silicon is formed prior to forming said doped layer.

24. A method of manufacturing as recited in claim 13, wherein said third polycrystalline silicon layer includes impurities into said transitional silicon from said third polycrystalline silicon layer.

* * * * *